United States Patent
Draxelmayr (10) Patent No.: US 8,513,973 B2
(45) Date of Patent: *Aug. 20, 2013

(54) MITIGATING SIDE EFFECTS OF IMPEDANCE TRANSFORMATION CIRCUITS

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/281,416

(22) Filed: Oct. 25, 2011

(65) Prior Publication Data

US 2012/0038419 A1    Feb. 16, 2012

Related U.S. Application Data

(63) Continuation of application No. 12/685,894, filed on Jan. 12, 2010, now Pat. No. 8,067,958.

(51) Int. Cl.
*H03K 19/003* (2006.01)
*H03K 17/16* (2006.01)

(52) U.S. Cl.
USPC ............. 326/33; 326/30; 326/81; 327/333; 327/541; 327/543; 330/296

(58) Field of Classification Search
USPC ........... 326/30, 33, 63, 68, 80–81; 327/333, 327/541, 543, 581; 330/296, 302
See application file for complete search history.

(56) References Cited

U.S. PATENT DOCUMENTS

| 4,023,112 | A  | * | 5/1977  | Duncker et al. | 330/293 |
|-----------|----|---|---------|----------------|---------|
| 6,225,756 | B1 | * | 5/2001  | Gitsevich      | 315/248 |
| 6,781,417 | B1 | * | 8/2004  | Le et al.      | 326/83  |
| 7,061,298 | B2 | * | 6/2006  | Mentze et al.  | 327/333 |
| 7,420,405 | B2 | * | 9/2008  | Washburn et al.| 327/333 |
| 7,619,476 | B2 | * | 11/2009 | Harman         | 330/267 |
| 8,067,958 | B2 | * | 11/2011 | Draxelmayr     | 326/33  |
| 2008/0136381 | A1 | * | 6/2008  | Yang et al.    | 323/220 |
| 2010/0308906 | A1 | * | 12/2010 | Draxelmayr     | 327/581 |

* cited by examiner

*Primary Examiner* — Jason M Crawford
(74) *Attorney, Agent, or Firm* — SpryIP, LLC (57) ABSTRACT

Implementations to mitigating side effects of impedance transformation circuits are described. In particular, mitigation circuitry may be coupled to a high impedance circuit to minimize or eliminate non-linear output of the high impedance circuit in order to provide a well-defined bias voltage to the input of a buffer or amplifier device coupled to a capacitive sensor. Additionally, the mitigation circuitry may be coupled to the high impedance circuit to reduce or eliminate rectifying effects of the high impedance circuit. Accordingly, a bias voltage can be utilized to provide a stable operating point of the buffer or amplifier device via a high impedance circuit utilizing one or more impedance transformations.

25 Claims, 7 Drawing Sheets

MITIGATING SIDE EFFECTS OF IMPEDANCE TRANSFORMATION CIRCUITS

RELATED APPLICATIONS

This Application is a Continuation Application of co-pending application Ser. No. 12/685,894, which was filed on Jan. 10, 2010. The entire contents of application Ser. No. 12/685,894 are hereby incorporated herein by reference.

BACKGROUND

An amplifier device or buffer can require very high input impedance. For example, an amplifier device or buffer may have an input that is high ohmic when receiving signals from a capacitive sensor having a capacitance of a few picofarads. In some instances, a bias voltage may be needed to define the DC operating point of the amplifier device or buffer. A high impedance device, such as a device having an impedance in the giga-ohm range, may be placed between the amplifier device or buffer and a bias point to provide a high impedance input to the amplifier device or buffer. The high impedance device may utilize impedance transformations to provide a high impedance to the input of the amplifier device or buffer.

One impedance transformation technique relates to coupling a pair of transistor circuits in a current mirror type arrangement with each transistor circuit of the pair having a different channel width to channel length (W/L) ratio. In some implementations, the transistor circuit having a lower W/L ratio acts as an impedance device. In these implementations, the quotient in the W/L ratios of the transistor circuits is proportional to the impedance transformation. To illustrate, when the W/L ratio of a first transistor circuit is approximately ten times larger than the W/L ratio of a second transistor circuit, the impedance value of the second transistor circuit increases by a factor of ten.

Additionally, an impedance transformation may take place due to differences in overdrive voltages of transistor circuit pairs coupled in a current mirror type arrangement. An overdrive voltage is defined by a gate-source voltage of a transistor circuit minus a threshold voltage of the transistor circuit. A transistor circuit having an overdrive voltage lower than the overdrive voltage of another transistor circuit may serve as an impedance device. In some implementations, at least the transistor circuit with the lower overdrive voltage is operating with a gate-source voltage in the sub-threshold region. A transistor circuit is operating with a gate-source voltage in the sub-threshold region when the gate-source voltage is less than the voltage that turns on the transistor circuit (i.e. when the overdrive voltage is a negative value). When the gate-source voltage of the transistor circuit serving as the impedance device is in the sub-threshold region, the impedance increases exponentially in relation to the difference between the overdrive voltages of a pair of transistors. For example, when the overdrive voltage of the impedance device transistor is a specified amount lower than the overdrive voltage of another transistor circuit, the impedance of the impedance device transistor may increase by a factor of ten. In one illustration, the impedance of the impedance device transistor may increase by a factor of ten for every 80-90 mV difference between the overdrive voltages of the transistor circuits. In some implementations, the differences in the overdrive voltages may be produced via the gates of the transistor circuits. In other implementations, the differences in the overdrive voltages may be produced via the sources of the transistor circuits.

In some instances, transistor circuit pairs arranged in current mirror type arrangements to produce impedance transformations may have non-linear outputs. Further, even order distortion may produce rectifying effects that shift the DC operating point of the amplifier device or buffer.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

This disclosure describes mitigating side effects of impedance transformation circuits. In particular, mitigation circuitry may be coupled to a high impedance circuit to minimize or eliminate non-linear output of the high impedance circuit in order to provide a well-defined bias voltage to the input of a buffer or amplifier device coupled to a capacitive sensor. Additionally, the mitigation circuitry may be coupled to the high impedance circuit to reduce or eliminate rectifying effects of the high impedance circuit. Accordingly, a bias voltage can be utilized to provide a stable operating point of the buffer or amplifier device via a high impedance circuit utilizing one or more impedance transformations.

Figure 1:
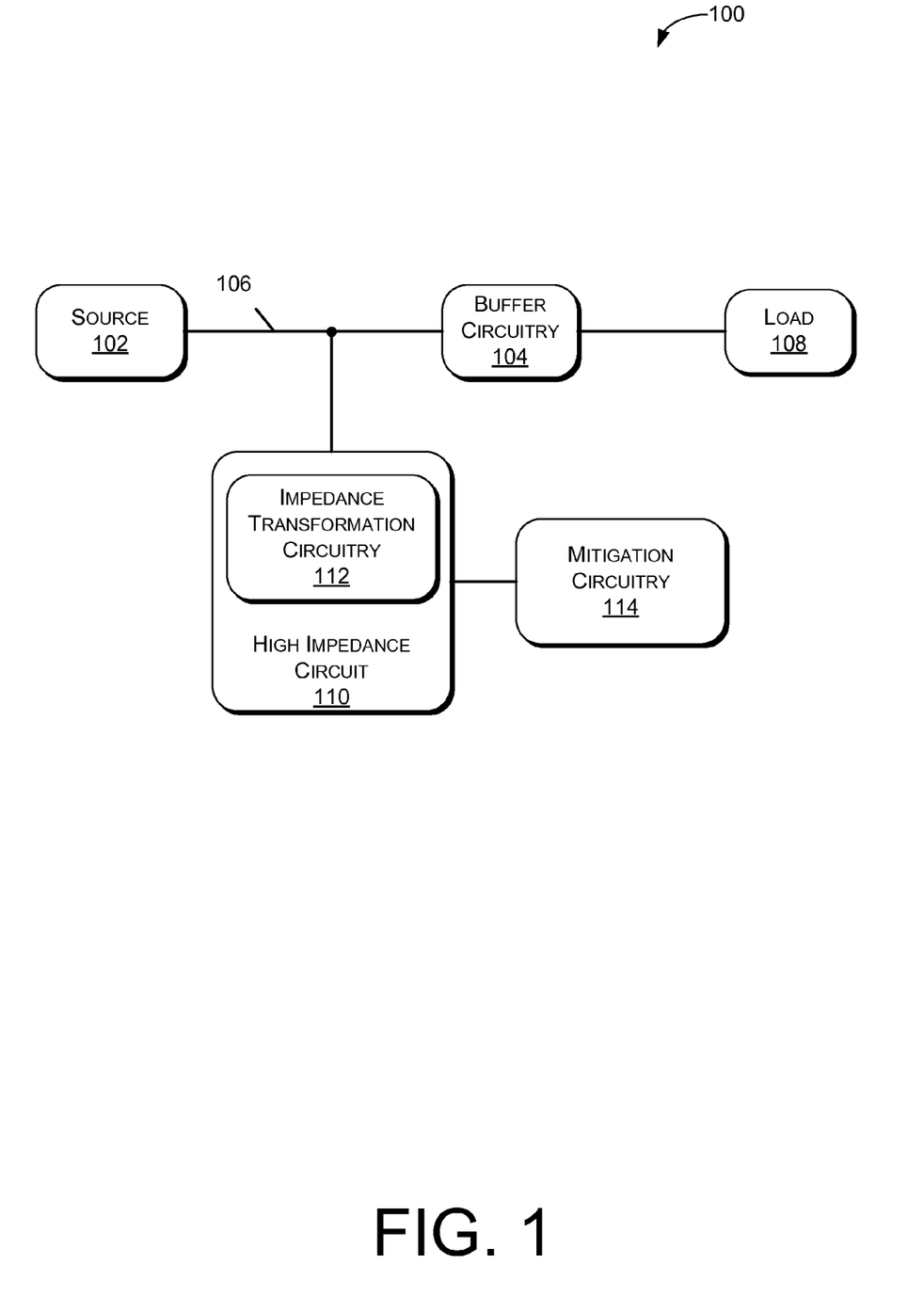
FIG. 1 is a schematic diagram of a system including a high impedance circuit coupled between a source and buffer circuitry and coupled to mitigation circuitry.

FIG. 1 is a schematic diagram of a system 100 to provide high impedance at an input of a buffer. A source 102 and buffer circuitry 104 are connected by a source-buffer line 106. The source 102 may include one or more circuit arrangements that provide input signals to the buffer circuitry 104. The input signals may include radio frequency signals, audio signals, digital signals, other signals carrying data, or a combination thereof. In some implementations, the source 102 may be a capacitive voltage source. For example, the source 102 may be a silicon microphone.

The buffer circuitry 104 may include one or more circuit arrangements to buffer the signals received from the source 102 and provide them to a load 108. In some implementations, such as when the bias voltage is close to ground, the buffer circuitry 104 may include PMOS transistors coupled in a current mirror type arrangement. In other implementations, such as when the bias voltage is on the order of one or more volts, the buffer circuitry 104 may include NMOS transistor coupled in a current mirror type arrangement. Further, the buffer circuitry 104 may include operational amplifier circuitry. In some instances, the buffer circuitry 104 may require very high input impedance. For example, the buffer circuitry 104 may require very high input impedance when buffering a signal from a small capacitive sensor having a capacitance of a few picofarads and having low corner frequencies, such as a silicon microphone.

The buffer circuitry 104 may be coupled to a load 108. The load 108 may include an output device, such as an audio speaker, an analog to digital conversion circuit, a mixer, or a combination thereof.

The system 100 also includes a high impedance circuit 110 to provide a well-defined bias voltage to the buffer circuitry 104 at a very high impedance level, such as in the range of about 20 giga-ohms. Some examples of circuit arrangements that can be used to implement the high impedance circuit 110 are described with respect to FIG. 4 and FIG. 5.

The high impedance circuit 110 may utilize one or more impedance transformations to provide the high impedance input to the buffer circuitry 104. The one or more impedance transformations may be implemented via impedance transformation circuitry 112. The impedance transformation circuitry 112 may include an impedance device to provide an input impedance for the buffer circuitry 104 in the giga-ohm range. In some implementations, the impedance device may include at least one transistor circuit, such as at least one NMOS transistor and/or at least one PMOS transistor. In a particular illustrative implementation, the impedance device may include one or more NMOS transistors when the bias voltage is closer to ground. In another particular illustrative implementation, the impedance device may include one or more PMOS transistors when the bias voltage is closer to a positive supply voltage. The impedance transformation circuitry 112 may also include voltage shifting circuitry. The voltage shifting circuitry may provide a well-defined overdrive voltage to the one or more transistor circuits serving as the impedance device.

In an illustrative implementation, the impedance transformation circuitry may produce a first impedance transformation by utilizing one or more transistor circuit pairs including transistors having different channel width to channel length (W/L) ratios. For example, the first impedance transformation may be produced by a first transistor circuit having a first W/L ratio coupled in a current mirror type relationship to a second transistor circuit having a second W/L ratio that is less than the first W/L ratio. In this example, the second transistor circuit serves as an impedance device with an impedance transformation proportional to the quotient of the first W/L ratio and the second W/L ratio. The W/L ratio of a transistor circuit may be realized by a single transistor. Alternatively, the W/L ratio of a transistor circuit may be realized by connecting a number of transistors in parallel or by connecting a number of transistors in series.

The high impedance circuit 110 may also produce a second impedance transformation. The second impedance transformation may be produced by providing different overdrive voltages to each of a pair of transistor circuits coupled to each other. Different overdrive voltages may be produced when the difference between a gate-source voltage and a threshold voltage of a first transistor circuit of a transistor circuit pair is offset from the difference between a gate-source voltage and a threshold voltage of a second transistor circuit of the transistor circuit pair. In one example, a first transistor circuit and a second transistor circuit of a transistor circuit pair may have similar threshold voltages. In this example, the first transistor circuit may have a first gate-source voltage and the second transistor circuit may have a second gate-source voltage that is smaller than the first gate-source voltage. In this way, the first transistor circuit and the second transistor circuit have differing overdrive voltages. In another example, the first transistor circuit and the second transistor circuit of a transistor circuit pair may have similar gate-source voltages, but the first transistor circuit may have a first threshold voltage and the second transistor circuit may a second threshold voltage that is smaller than the first threshold voltage. Consequently, the first transistor circuit and the second transistor circuit have different overdrive voltages.

The difference between the overdrive voltages of the first transistor circuit and the second transistor circuit of a transistor circuit pair may be produced by placing the first transistor circuit and the second transistor circuit in various arrangements, such that the overdrive voltage of the transistor circuit serving as the impedance device is produced by offsetting the overdrive voltage of the other transistor circuit by a particular amount. In particular illustrative implementations, the first transistor circuit and the second transistor circuit are arranged in a current mirror type arrangement. In other implementations, the difference between the overdrive voltages of the first transistor circuit and the second transistor circuit is produced by modifying the gate-source voltage of the first transistor circuit via an impedance device, such as a resistor, feeding the modified gate-source voltage into a number of operational amplifiers, and providing the output voltage of the operational amplifier arrangement to the second transistor circuit.

In some implementations, the gate-source voltages of the first and second transistor circuits of a transistor circuit pair may be provided by voltage shifting circuitry coupled to the first transistor circuit and coupled to the second transistor circuit. Additionally, the respective gate-source voltages may be in the sub-threshold region of the transistor circuits. The gate-source voltages may be produced through the gates of the transistor circuits, the sources of the transistor circuits, or a combination thereof. Further, the second impedance transformation may be produced using a number of pairs of transistor circuits, with the transistor circuits of each respective pair having different overdrive voltages.

In some instances, the high impedance circuit 110 may provide a non-linear output. For example, the high impedance circuit 110 may be high ohmic with high voltage signals from the source 102, such as signals closer to a positive supply voltage, and low ohmic with low voltage signals from the source 102, such as signals closer to ground. The system 100 includes mitigation circuitry 114 coupled to the high impedance circuit 110 to offset any non-linear behavior exhibited by the high impedance circuit 110. In some implementations, the mitigation circuitry 114 may reduce non-linearity of the high impedance circuit 110 by reducing a voltage drop across the high impedance circuit 110. For example, a voltage divider may be placed between a bias point and the high impedance circuit 110 to reduce the strength of the signal provided to the high impedance circuit 110 from the bias point. To illustrate, the voltage divider may be situated between the bias point and a buffered version of the input signal to provide a signal to the high impedance circuit 110, where the signal has a mean value of the bias voltage and the buffered input signal voltage.

The high impedance circuit 110 may also produce some rectifying effects. For example, the high impedance circuit 110 may produce rectifying effects for even-order functions. The mitigation circuitry 114 may also offset at least some of the rectifying effects of the high impedance circuit 110. In some implementations, the mitigation circuitry 114 may provide a gate-source voltage to a transistor serving as an impedance device (also referred to herein as an "impedance device transistor") that is derived from the drain and source voltages of an impedance device transistor circuit. In an illustrative implementation, a voltage divider may provide a voltage to the gate of the impedance device transistor that is derived from approximately a mean value of the drain and source voltages of the impedance device transistor. Thus, the mitigation circuitry 114 may produce a gate voltage of the impedance device transistor that is symmetrical or nearly symmetrical with respect to a source and a drain of the impedance device transistor. By providing a voltage to the gate of the impedance device transistor that is derived from approximately the mean value of the drain and source voltages of the impedance device transistor, any rectifying effects produced by the high impedance circuit 110 are at least reduced, if not eliminated. By mitigating rectifying effects and non-linear output of the high impedance circuit 110, a well defined $R_{ON}$, that is, the impedance value that turns on the impedance device transistor, can be provided and a more stable operating point for the buffer circuitry 104 can be defined, as well. Additionally, in some implementations, the mitigation circuitry 114 may produce a voltage at a bulk node of the impedance device transistor that is symmetrical or nearly symmetrical with respect to the source and the drain of the impedance device transistor.

Figure 2:
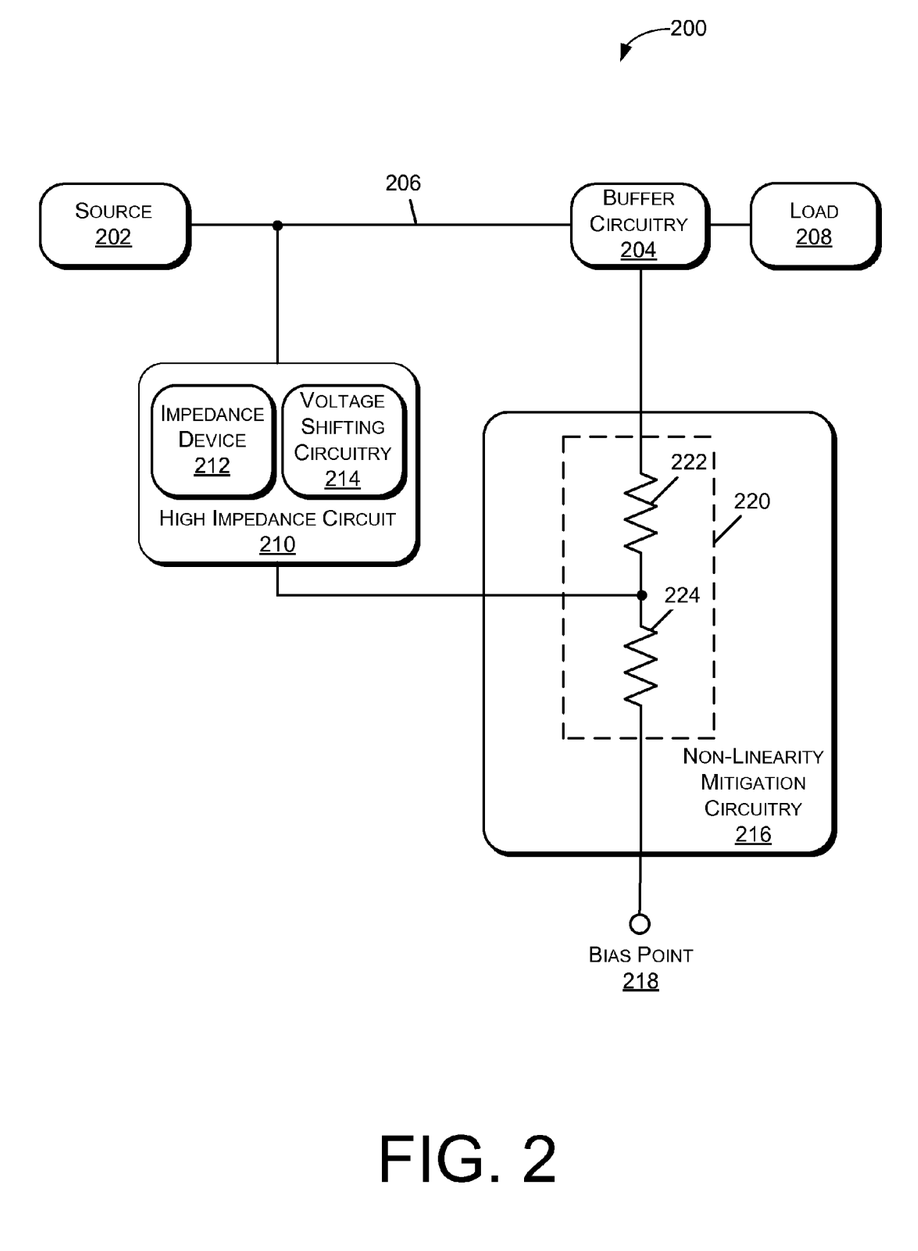
FIG. 2 is a schematic diagram of a system including a high impedance circuit coupled between a source and buffer circuitry and coupled to non-linearity mitigation circuitry.

FIG. 2 is a schematic diagram of a system 200 including a high impedance circuit coupled between a source and buffer circuitry and coupled to non-linearity mitigation circuitry. A source 202 and buffer circuitry 204 are connected by a source-buffer line 206. The buffer circuitry 204 may include one or more circuit arrangements to buffer the signals received from the source 202 and provide them to a load 208.

The system 200 also includes a high impedance circuit 210 to utilize one or more impedance transformations to provide a high impedance input to the buffer circuitry 204. The high impedance circuit 210 may include an impedance device 212 and voltage shifting circuitry 214. The impedance device 212 may include one or more transistor circuits configured to provide an impedance on the order of one or more giga-ohms at the input of the buffer circuitry 204 via one or more impedance transformations. In some implementations, the impedance device 212 may include at least one transistor circuit, such as at least one NMOS transistor circuit and/or at least one PMOS transistor circuit. A first impedance transformation may take place due to W/L ratios of transistor pairs of the high impedance circuit 210 coupled in a current mirror-type arrangement. For example, at least one transistor of the impedance device 212 may be coupled in a current mirror type arrangement to at least one transistor of the voltage shifting circuitry 214 with the at least one transistor of the impedance device 212 having a lower W/L ratio than at least one transistor of the voltage shifting circuitry 214. Another impedance transformation may occur due to differing overdrive voltages of transistor pairs of the high impedance circuit 210. In a particular implementation, at least one transistor of the impedance device 212 may be coupled in a current mirror type arrangement to at least one transistor of the voltage shifting circuitry 214 with the at least one transistor of the impedance device 212 having a lower overdrive voltage than at least one transistor of the voltage shifting circuitry 214. The different overdrive voltages may be produced by particular components of the voltage shifting circuitry 214.

The system 200 may also include non-linearity mitigation circuitry 216. The non-linearity mitigation circuitry 216 is coupled between the high impedance circuit 210 and a bias point 218. The bias point 218 may provide a bias voltage to the input of the buffer circuitry 204. The non-linearity mitigation circuitry 216 is also coupled to the buffer circuitry 204. Thus, one node of the non-linearity mitigation circuitry 216 has a value of about the bias voltage, while another node of the non-linearity mitigation circuitry 216 has a value of about a buffered version of the voltage signal provided by the source 202.

The non-linearity mitigation circuitry 216 may reduce or eliminate any non-linearities produced by the high impedance circuit 210 by reducing the voltage drop over the impedance device 212 of the high impedance circuit 210. For example, the non-linearity mitigation circuitry 216 may include a voltage divider 220 comprised of a first impedance device 222 and a second impedance device 224. In some implementations, the impedance values of the first impedance device 222 and the second impedance device 224 may be different. For example, the impedance value of the first impedance device 222 may be 75% of the impedance value of the second impedance device 224. In other implementations, the impedance values of the first impedance device 222 and the second impedance device 224 may be approximately equal. The first impedance device 222 and the second impedance device 224 may be comprised of one or more resistors, one or more transistors, one or more capacitors, one or more inductors, or a combination thereof.

The non-linearity mitigation circuitry 216 is located between the high impedance circuit 210 and the bias point 218 to reduce the bias voltage received at the high impedance circuit 210. Additionally, the buffer circuitry 204, the high impedance circuit 210, the non-linearity mitigation circuitry 216, and the bias point 218 comprise a closed regulation loop that converges with the input and the output of the buffer circuitry 204 at the bias voltage. In an illustrative implementation, the non-linearity mitigation circuitry 216 is coupled to a source of at least one transistor of the impedance device 212. Accordingly, when the impedance value of the first impedance device 222 and the impedance value of the second impedance device 224 are approximately equal, the source of the at least one transistor of the impedance device 212 receives a signal having a value of about the middle value between the bias voltage and the buffered input signal voltage. Thus, the voltage drop across the at least one transistor of the impedance device 212 is reduced and, consequently, the behavior of the impedance device 212 is linearized. Further, the values of the first impedance device 222 and the second impedance device 224 may be modified to provide a weighted average of the bias voltage to the at least one transistor of the impedance device 212. In this way, the mean voltage provided to the at least one transistor of the impedance device 212 may be shifted closer to the bias voltage or closer to the input voltage from the source 202.

Figure 3:
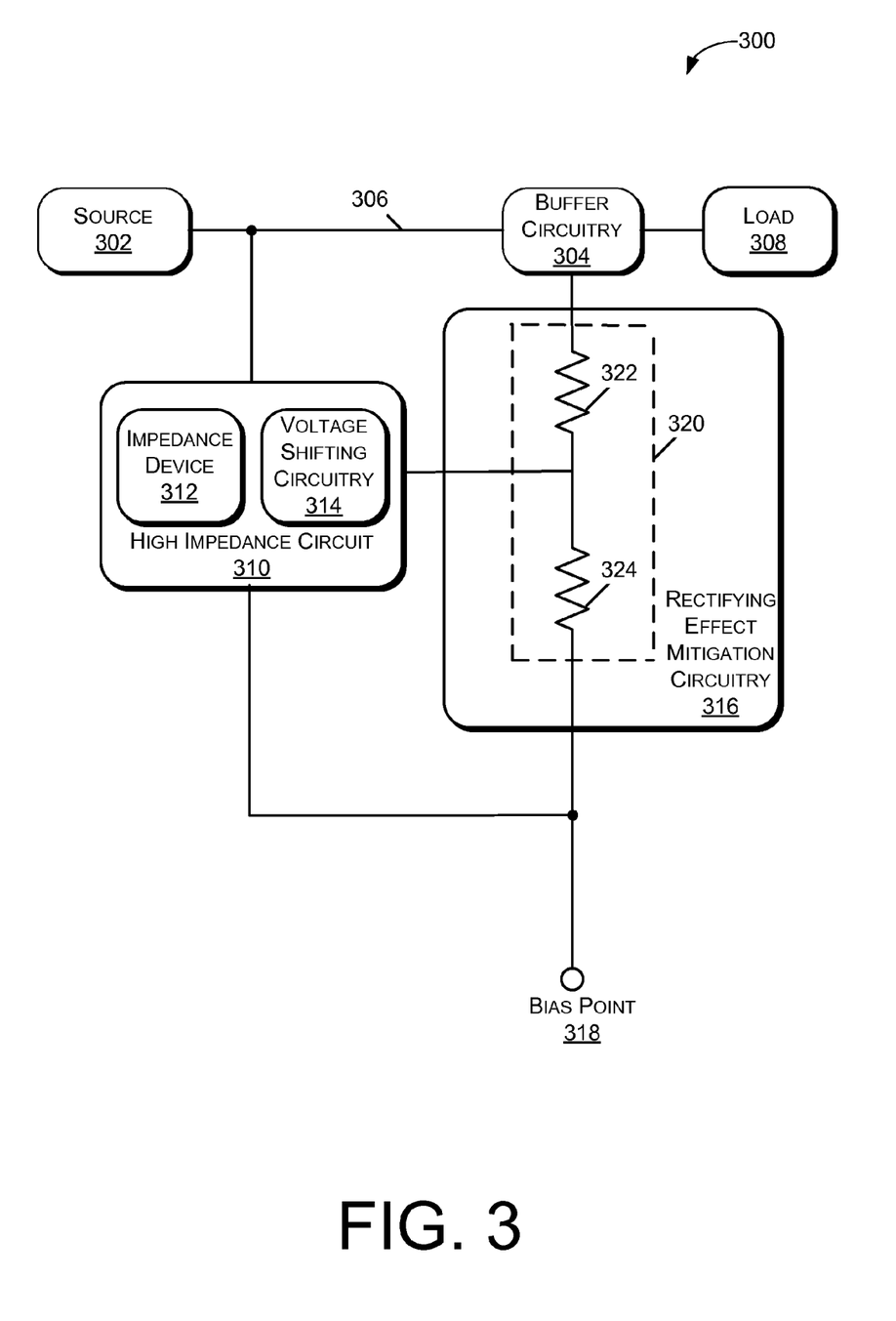
FIG. 3 is a schematic diagram of a system including a high impedance circuit coupled between a source and buffer circuitry and coupled to rectifying effect mitigation circuitry.

FIG. 3 is a schematic diagram of a system 300 including a high impedance circuit coupled between a source and buffer circuitry and coupled to rectifying effect mitigation circuitry. A source 302 and buffer circuitry 304 are connected by a source-buffer line 306. The buffer circuitry 304 may include one or more circuit arrangements to buffer the signals received from the source 302 and provide them to a load 308.

The system 300 also includes a high impedance circuit 310 to utilize one or more impedance transformations to provide a high impedance input to the buffer circuitry 304. The high impedance circuit 310 may include an impedance device 312 and voltage shifting circuitry 314. The impedance device 312 may include one or more transistor circuits configured to provide an impedance on the order of one or more giga-ohms at the input of the buffer circuitry 304 via one or more impedance transformations. In some implementations, the impedance device 312 may include at least one transistor circuit, such as at least one NMOS transistor circuit and/or at least one PMOS transistor circuit. A first impedance transformation may take place due to W/L ratios of transistor pairs of the high impedance circuit 310 coupled in a current mirror-type arrangement. For example, at least one transistor of the impedance device 312 may be coupled in a current mirror type arrangement to at least one transistor of the voltage shifting circuitry 314 with the at least one transistor of the impedance device 312 having a lower W/L ratio than at least one transistor of the voltage shifting circuitry 314. Another impedance transformation may occur due to differing overdrive voltages of transistor pairs of the high impedance circuit 310. In a particular implementation, at least one transistor of the impedance device 312 may be coupled in a current mirror type arrangement to at least one transistor of the voltage shifting circuitry 314 with the at least one transistor of the impedance device 312 having a lower overdrive voltage than the at least one transistor of the voltage shifting circuitry 314. The different overdrive voltages may be produced by particular components of the voltage shifting circuitry 314, such as one or more resistors, one or more current sources, one or more transistors, one or more amplifier devices, or a combination thereof.

The system 300 may also include rectifying effect mitigation circuitry 316. The rectifying effect mitigation circuitry 316 is coupled between the buffer circuitry 304 and a bias point 318. The rectifying effect mitigation circuitry 316 may include a voltage divider 320 comprising a first impedance device 322 and a second impedance device 324. In some implementations, the impedance value of the first impedance device 322 is approximately equal to the impedance value of the second impedance device 324. Further, the system 300 may include non-linearity mitigation circuitry (not shown), such as the non-linearity mitigation circuitry 216 of FIG. 2, in addition to the rectifying effect mitigation circuitry 316. In some instances, the impedance devices of the rectifying effect mitigation circuitry 316 may also be included in the non-linearity mitigation circuitry. For example, the second impedance device 324 may also be included in the non-linearity mitigation circuitry, such as the first impedance device 220 of FIG. 2.

In an illustrative implementation, the impedance device 312 includes at least one transistor with a gate-source voltage defined by the source voltage and the drain voltage of the at least one transistor of the impedance device 312. The rectifying effect mitigation circuitry 316 may provide a gate voltage to the at least one transistor of the impedance device 312 based on the mean of the source voltage of the at least transistor of the impedance device 312 and the drain voltage of the at least one transistor of the impedance device 312. In this way, a positive half-wave of an input signal from the source 302 experiences approximately the same conditions as a negative half-wave of the input signal. Thus, the at least one transistor of the impedance device 312 experiences nearly symmetrical conditions regardless of whether the source voltage or the drain voltage of the at least one transistor is higher and the on-resistance, $R_{ON}$, of the at least one transistor is relatively stable for positive voltage signals and negative voltage signals received from the source 302. Thus, any rectifying effects produced by the high impedance circuit 310 may be minimized or eliminated.

Figure 4:
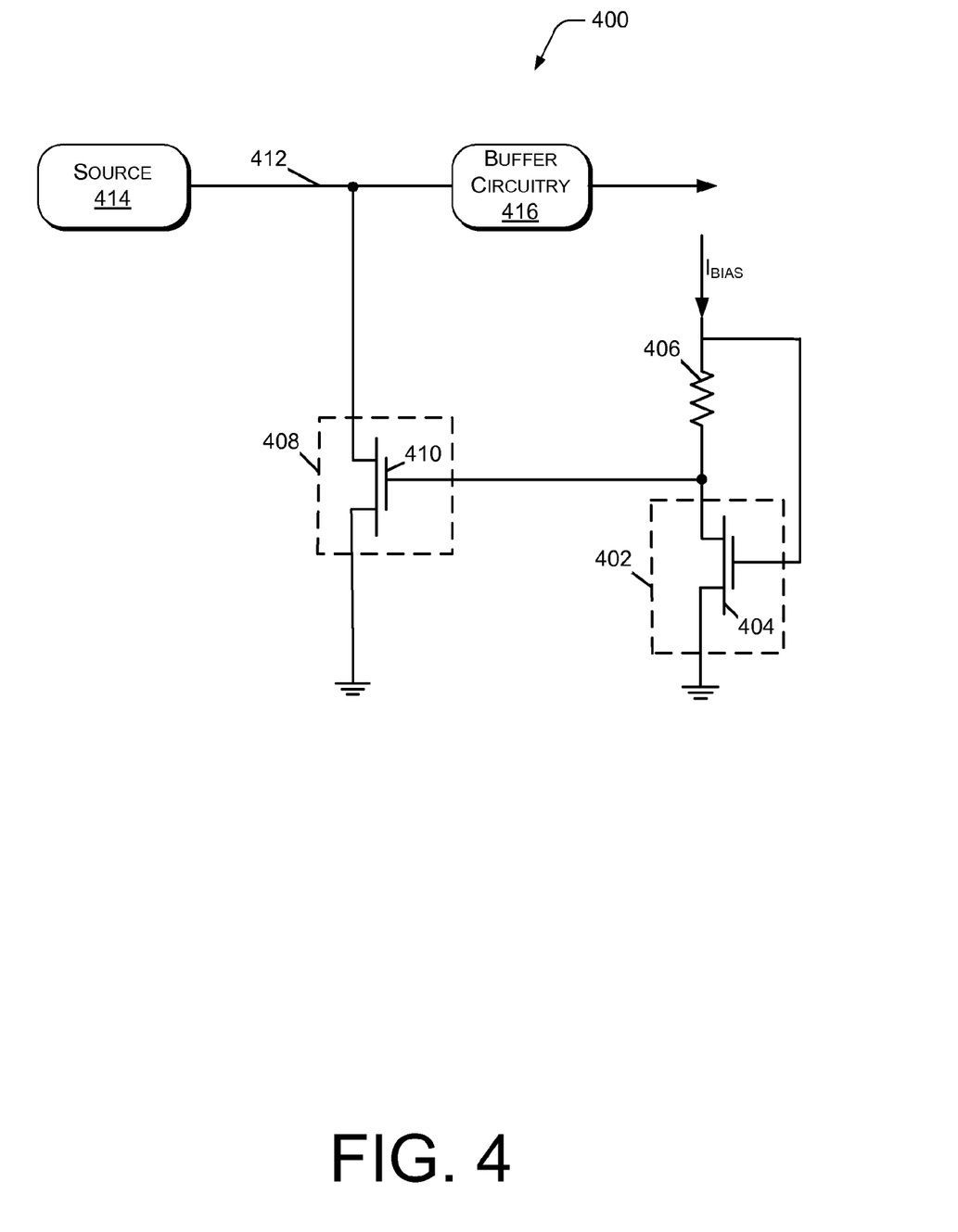
FIG. 4 is a schematic circuit diagram of a high impedance circuit having a gate to drain coupling of negative channel metal oxide semiconductor (NMOS) transistor circuits having different overdrive voltages.

FIG. 4 is a schematic circuit diagram of a high impedance circuit 400 having a gate to drain coupling of NMOS transistor circuits having different overdrive voltages. The high impedance circuit 400 may be included in the high impedance circuit 110 of FIG. 1, the high impedance circuit 210 of FIG. 2, and/or the high impedance circuit 310 of FIG. 3.

The high impedance circuit 400 includes a first transistor circuit 402. The first transistor circuit 402 may have a first channel width to channel length (W/L) ratio. In addition, the first transistor circuit 402 includes one or more NMOS transistors represented by a first NMOS transistor 404. Thus, the W/L ratio of the first transistor circuit 402 may be realized in a single NMOS transistor or in a number of NMOS transistors. In some instances, the W/L ratio may be realized by a number of NMOS transistors connected in parallel. A source of the first NMOS transistor 404 may be coupled to a reference point, such as ground, and a drain of the first NMOS transistor 404 is coupled to an impedance element 406. A bias current, $I_{BIAS}$, is provided to the impedance element 406 from a bias point. Further, the bias current, $I_{BIAS}$, may also be provided to a gate of the first NMOS transistor 404. In some implementations, one or more of the reference points may be replaced by a bias point.

The high impedance circuit 400 also includes a second transistor circuit 408. In the illustrative implementation shown in FIG. 4, the first transistor circuit 402 and the second transistor circuit 408 are placed in a current mirror type arrangement. The second transistor circuit 408 may have a second W/L ratio that is less than the first W/L ratio. The W/L ratio of the second transistor circuit 408 may be realized by one or more NMOS transistors represented by a second NMOS transistor 410. In some instances, the W/L ratio of the second transistor circuit 408 may be realized by a number of NMOS transistors connected in series. A gate of the second NMOS transistor 410 is coupled to the drain of the first NMOS transistor 404 and a source of the second NMOS transistor 410 may be coupled to a reference point, such as ground. Further, a drain of the second NMOS transistor 410 is coupled to a source-buffer line 412. The source-buffer line 412 is coupled between a source 414 and buffer circuitry 416, such as the source-buffer line 106 connecting the source 102 and the buffer circuitry 104 of FIG. 1.

A gate-source voltage of the first NMOS transistor 404 is defined by the current, $I_{BIAS}$, and the gate-source voltage of the second NMOS transistor 410 is defined by a difference of the gate-source voltage of the first NMOS transistor 404 and a voltage defined by the product of the impedance value of the impedance element 406 and the value of the current $I_{BIAS}$. In some implementations, the gate-source voltage of the first NMOS transistor 404 may be in the sub-threshold region, the gate-source voltage of the second NMOS transistor 410 may be in the sub-threshold region, or a combination thereof.

An impedance transformation may occur by producing different overdrive voltages of the first NMOS transistor 404 and the second NMOS transistor 410. In some implementations, an overdrive voltage of the first NMOS transistor 404 may be different from an overdrive voltage of the second NMOS transistor 410 due to differing gate-source voltages at the first NMOS transistor 404 and the second NMOS transistor 410, while the threshold voltages of the first NMOS transistor 404 and the second NMOS transistor 410 are approximately the same. In these implementations, the difference between the gate-source voltage of the first NMOS transistor 404 and the gate-source voltage of the second NMOS transistor 410 is due to the impedance element 406 coupled to the drain of the first NMOS transistor 404. In other implementations, the overdrive voltage of the first NMOS transistor 404 may be different from the overdrive voltage of the second NMOS transistor 410 due to differing threshold voltages of the first NMOS transistor 404 and the second NMOS transistor 410, while the gate-source voltages of the first NMOS transistor 404 and the second NMOS transistor are approximately the same. In a particular example, when the overdrive voltage of the second NMOS transistor 410 is less than the overdrive voltage of the first NMOS transistor 404, the impedance value of the first NMOS transistor 404 is transformed to the impedance value of the second NMOS transistor 410 giving a very high impedance value for the high impedance circuit 400. When the gate-source voltage of the second NMOS transistor 410 is in the sub-threshold region, the impedance of the second NMOS transistor 410 may increase exponentially as the overdrive voltage of the second NMOS transistor 410 decreases. The amount of increase in the impedance of the second NMOS transistor 410 may be based on the difference in the overdrive voltages of the first NMOS transistor 404 and the second NMOS transistor 410.

Further, when the W/L ratio of the second transistor circuit 408 is less than the W/L ratio of the first transistor circuit 402, the second transistor circuit 408 may serve as an impedance device and an impedance transformation may take place with respect to the second transistor circuit 408 that is proportional to the quotient of the W/L ratio of the first transistor circuit 402 and the W/L ratio of the second transistor circuit 408. Thus, by producing an impedance transformation due to differing overdrive voltages of the first NMOS transistor 404 and the second NMOS transistor 410 and by producing an impedance transformation due to differing W/L ratios of the first transistor circuit 402 and the second transistor circuit 408, the high impedance circuit 400 can provide very high input impedance for buffer circuitry, such as the buffer circuitry 104 of FIG. 1.

Figure 5:
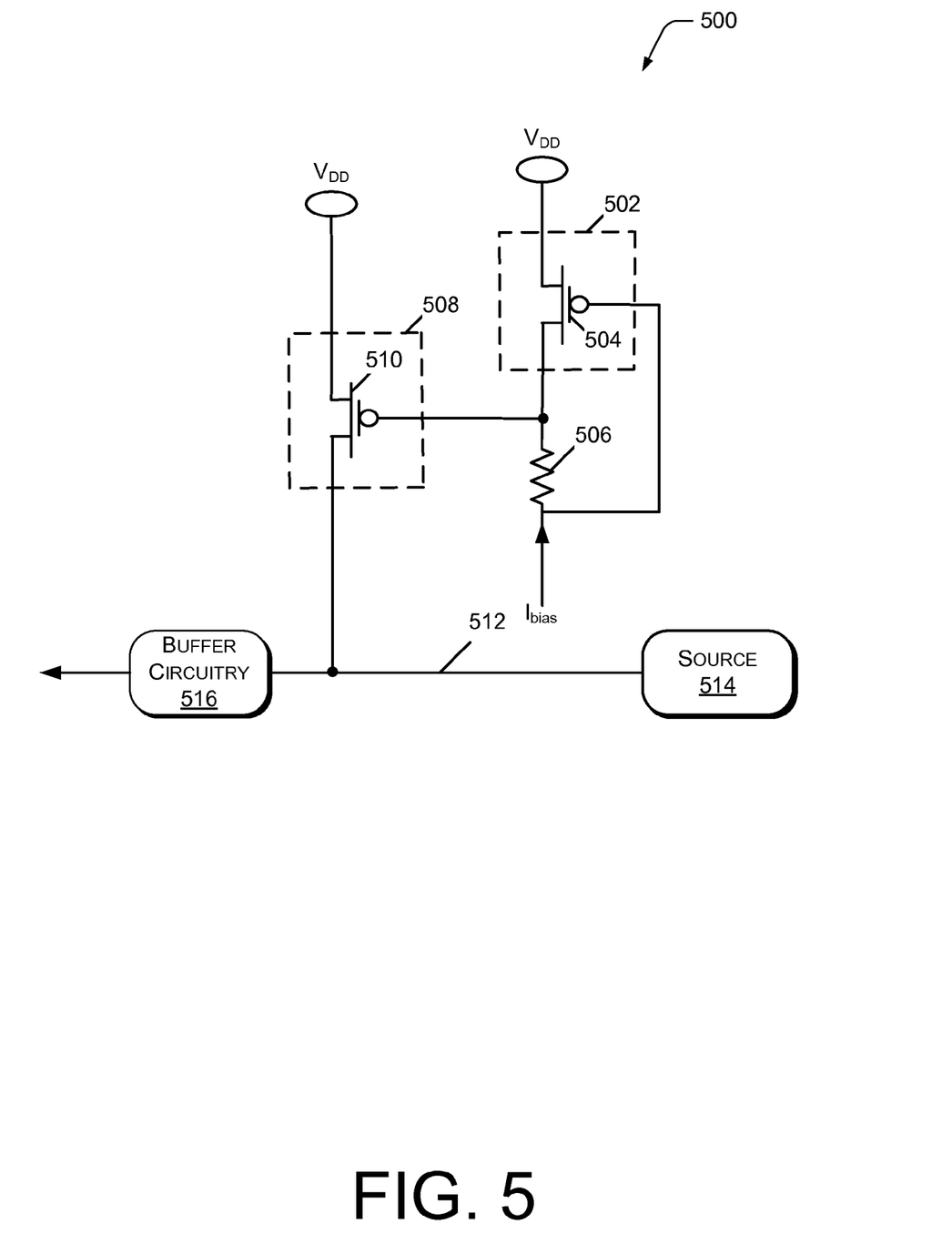
FIG. 5 is a schematic circuit diagram of a high impedance circuit having a gate to drain coupling of positive channel metal oxide semiconductor (PMOS) transistor circuits having different overdrive voltages.

FIG. 5 is a schematic circuit diagram of a high impedance circuit 500 having a gate to drain coupling of PMOS transistor circuits having different overdrive voltages. The high impedance circuit 500 may be included in the high impedance circuit 110 of FIG. 1, the high impedance circuit 210 of FIG. 2, and/or the high impedance circuit 310 of FIG. 3.

The high impedance circuit 500 includes a first transistor circuit 502. The first transistor circuit 502 may have a first channel width to channel length (W/L) ratio. In addition, the first transistor circuit 502 includes one or more PMOS transistors represented by a first PMOS transistor 504. Thus, the W/L ratio of the first transistor circuit 502 may be realized in a single PMOS transistor or in a number of PMOS transistors. In some instances, the W/L ratio may be realized by a number of PMOS transistors connected in parallel. A source of the first PMOS transistor 504 may be coupled to a positive supply voltage, $V_{DD}$, and a drain of the first PMOS transistor 504 is coupled to an impedance element 506. A bias current, $I_{BIAS}$, is provided to the impedance element 506 from a bias point. Further, the bias current, $I_{BIAS}$, may also be provided to a gate of the first PMOS transistor 504. In some implementations, one or more of the reference points may be replaced by a bias point.

The high impedance circuit 500 also includes a second transistor circuit 508. In the illustrative implementation shown in FIG. 5, the first transistor circuit 502 and the second transistor circuit 508 are placed in a current mirror type arrangement. The second transistor circuit 508 may have a second W/L ratio that is less than the first W/L ratio. The W/L ratio of the second transistor circuit 508 may be realized by one or more PMOS transistors represented by a second PMOS transistor 510. In some instances, the W/L ratio of the second transistor circuit 508 may be realized by a number of PMOS transistors connected in series. A gate of the second PMOS transistor 510 is coupled to the drain of the first PMOS transistor 504 and a source of the second PMOS transistor 510 may be coupled to the positive supply voltage, $V_{DD}$. Further, a drain of the second PMOS transistor 510 is coupled to a source-buffer line 512. The source-buffer line 512 is coupled between a source 514 and buffer circuitry 516, such as the source-buffer line 106 connecting the source 102 and the buffer circuitry 104 of FIG. 1.

A gate source voltage of the first PMOS transistor 504 is defined by the current, $I_{BIAS}$, and the gate-source voltage of the second PMOS transistor 510 is defined by a difference of the gate-source voltage of the first PMOS transistor 504 and a voltage defined by the product of the impedance value of the impedance element 506 and the value of the current $I_{BIAS}$. In some implementations, the gate-source voltage of the first PMOS transistor 504 may be in the sub-threshold region, the gate-source voltage of the second PMOS transistor 510 may be in the sub-threshold region, or a combination thereof.

An impedance transformation may occur by producing different overdrive voltages of the first PMOS transistor 504 and the second PMOS transistor 510. In some implementations, an overdrive voltage of the first PMOS transistor 504 may be different from an overdrive voltage of the second PMOS transistor 510 due to differing gate-source voltages at the first PMOS transistor 504 and the second PMOS transistor 510, while the threshold voltages of the first PMOS transistor 504 and the second PMOS transistor 510 are approximately the same. In these implementations, the difference between the gate-source voltage of the first PMOS transistor 504 and the gate-source voltage of the second PMOS transistor 510 is due to the impedance element 506 coupled to the drain of the first PMOS transistor 504. In other implementations, the overdrive voltage of the first PMOS transistor 504 may be different from the overdrive voltage of the second PMOS transistor 510 due to differing threshold voltages of the first PMOS transistor 504 and the second PMOS transistor 510, while the gate-source voltages of the first PMOS transistor 504 and the second PMOS transistor 510 are approximately the same. In a particular example, when the overdrive voltage of the second PMOS transistor 510 is less than the overdrive voltage of the first PMOS transistor 504, the impedance value of the first PMOS transistor 504 is transformed to the impedance value of the second PMOS transistor 510 giving a very high impedance value for the high impedance circuit 500. When the gate-source voltage of the second PMOS transistor 510 is in the sub-threshold region, the impedance of the second PMOS transistor 510 may increase exponentially as the overdrive voltage of the second PMOS transistor 510 decreases. The amount of increase in the impedance of the second PMOS transistor 510 may be based on the difference in the overdrive voltages of the first PMOS transistor 504 and the second PMOS transistor 510.

Further, when the W/L ratio of the second transistor circuit 508 is less than the W/L ratio of the first transistor circuit 502, the second transistor circuit 508 may serve as an impedance device and an impedance transformation may take place with respect to the second transistor circuit 508 that is proportional to the quotient of the W/L ratio of the first transistor circuit 502 and the W/L ratio of the second transistor circuit 508. Thus, by producing an impedance transformation due to differing overdrive voltages of the first PMOS transistor 504 and the second PMOS transistor 510 and by producing an impedance transformation due to differing W/L ratios of the first transistor circuit 502 and the second transistor circuit 508, the high impedance circuit 500 can provide very high input impedance for an amplifier device, such as the buffer circuitry 104 of FIG. 1.

Figure 6:
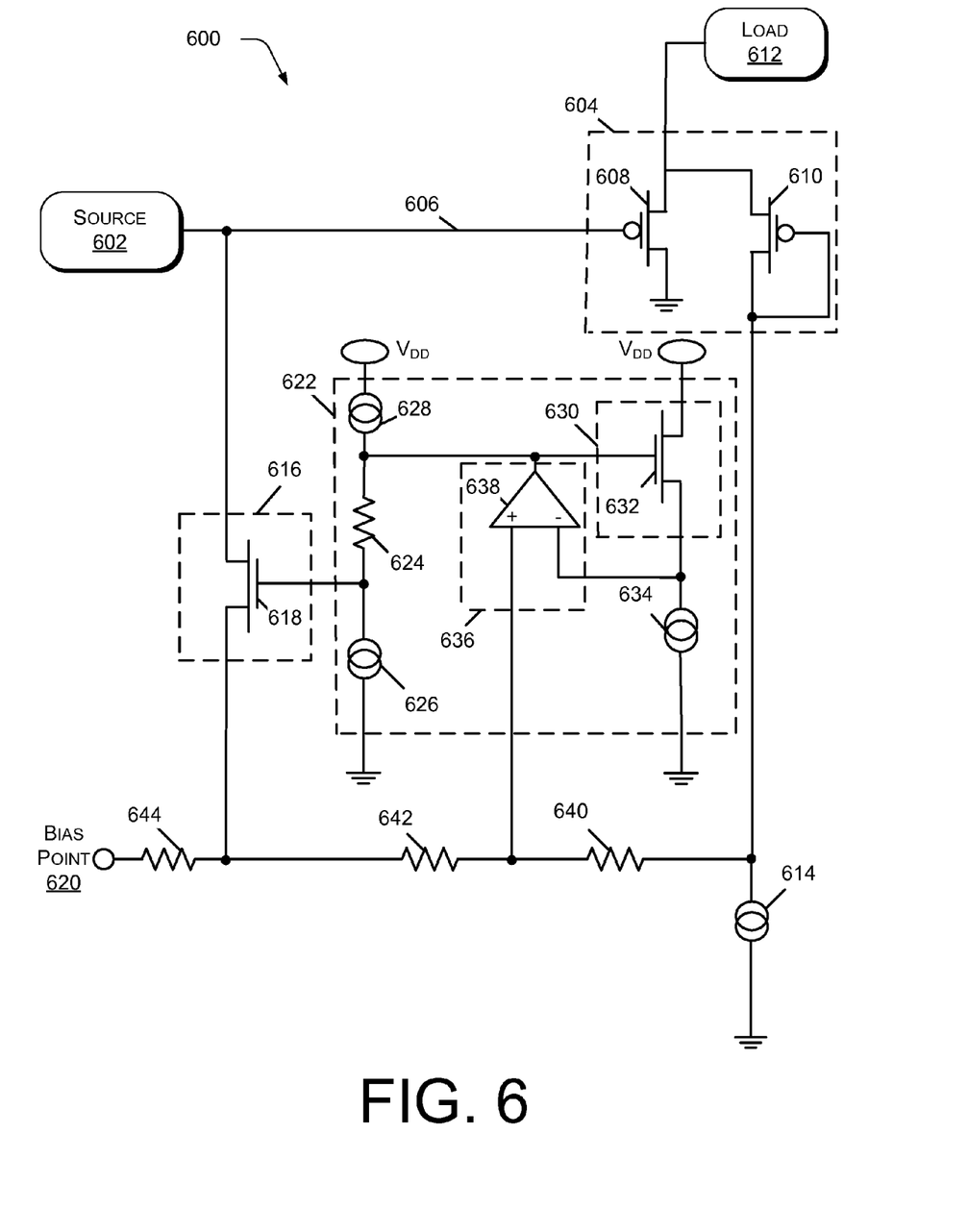
FIG. 6 is a schematic circuit diagram of a high impedance circuit including NMOS transistor circuits having different overdrive voltages and coupled to non-linearity mitigation circuitry and rectifying effects mitigation circuitry.

FIG. 6 is a schematic circuit diagram of a high impedance circuit 600 including NMOS transistor circuits having different overdrive voltages and coupled to non-linearity mitigation circuitry and rectifying effects mitigation circuitry. The system 600 includes a source 602 coupled to buffer circuitry 604 via a source-buffer line 606. The buffer circuitry 604 includes a first PMOS transistor 608 and a second PMOS transistor 610. In some implementations, the first PMOS transistor 608 is a source-follower. In addition, the buffer circuitry 604 may provide a buffered version of a voltage signal received from the source 602.

In the implementation shown in FIG. 6, a gate of the first PMOS transistor 608 is coupled to the source-buffer line 606. A drain of the first PMOS transistor 608 is coupled to a reference point, such as ground, and a source of the first PMOS transistor 608 is coupled to a source of the second PMOS transistor 610 and to a load 612. A gate and drain of the second PMOS transistor 610 may be coupled to a first current source 614. The first current source 614 may be coupled to a reference point, such as ground. Although FIG. 6 illustrates a particular configuration for the buffer circuitry 604, the configuration of the buffer circuitry 604 is not limited to the arrangement shown in FIG. 6. For example, PMOS transistors may be included in the buffer circuitry 604 with bias voltages closer to ground, while the buffer circuitry 604 may include NMOS transistors with bias voltages on the order of one volt. In another example, the buffer circuitry 604 may include an operational amplifier.

The system 600 also includes a first transistor circuit 616. The first transistor circuit 616 may have a first channel width to channel length (W/L) ratio. In addition, the first transistor circuit 616 includes one or more NMOS transistors, represented by the first NMOS transistor 618. Thus, in some implementations the W/L ratio of the first transistor circuit 616 may be realized in a single NMOS transistor or in a number of NMOS transistors connected in series. A drain of the first NMOS transistor 618 is coupled to the source-buffer line 606 and a source of the first NMOS transistor 618 is coupled to a bias point 620. Further, a gate of the first NMOS transistor 618 may be coupled to voltage shifting circuitry 622. For example, in the implementation shown in FIG. 6, the gate of the first NMOS transistor 618 is coupled between a first impedance device 624 and a second current source 626 of the voltage shifting circuitry 622. The second current source 626 is connected to a reference point, such as ground, and the second current source 626 may provide a specified voltage drop across the first impedance device 624. The first impedance device 624 may also be coupled to a third current source 628 of the voltage shifting circuitry 622. The third current source 628 is connected to a reference point, such as the positive supply voltage $V_{DD}$.

The voltage shifting circuitry 622 also includes a second transistor circuit 630. The second transistor circuit 630 and the first transistor circuit 616 may be placed in a current mirror type arrangement. The second transistor circuit 630 may have a W/L ratio that is greater than the W/L ratio of the first transistor circuit 616. The W/L ratio of the second transistor circuit 630 may be realized by one or more NMOS transistors represented by the second NMOS transistor 632. In some implementations, the W/L ratio of the second transistor circuit 630 may be realized by a number of NMOS transistor circuits connected in parallel. A drain of the second NMOS transistor 632 may be connected to a reference point, such as the positive supply voltage, $V_{DD}$, and a source of the second NMOS transistor 630 may be coupled to a fourth current source 634 of the voltage shifting circuitry 622. The fourth current source 634 may be connected to a reference point, such as ground. Additionally, a gate of the second NMOS transistor 632 may be coupled to additional buffer circuitry 636 of the voltage shifting circuitry 622. The additional buffer circuitry 636 may include an amplifier device 638. In some implementations, the amplifier device 638 may be an operational transconductance amplifier (OTA), while in other implementations the amplifier device 638 may be an operational amplifier. When the amplifier device 638 is an operational amplifier, the third current source 628 may be optional in some instances. Although the additional buffer circuitry 636 includes an amplifier device 638 in FIG. 6, the additional buffer circuitry 636 is not limited to the configuration shown in FIG. 6.

An inverting input of the amplifier device 638 may be coupled between the second NMOS transistor 632 and the fourth current source 634. In addition, a non-inverting input of the amplifier device 638 is coupled between a second impedance device 640 and a third impedance device 642. The additional buffer circuitry 636 may be operable to produce a voltage at the node coupled between the inverting input of the amplifier device 638, the fourth current source 634, and the second NMOS transistor 632 that is approximately the same as a voltage of the node coupled between the non-inverting input of the amplifier device 638, the second impedance device 640, and the third impedance device 642.

The second and third impedance devices 640, 642 may comprise rectifying effects mitigation circuitry, such as the rectifying effects mitigation circuitry 316 of FIG. 3, to reduce or eliminate even order distortion produced by the system 600. Further, a fourth impedance device 644 may be coupled between the third impedance device 642 and the bias point 620. The fourth impedance device 644 may also be included in the rectifying effects mitigation circuitry. In some implementations, the third impedance device 642 and the fourth impedance device 644 may comprise non-linearity mitigation circuitry, such as the non-linearity mitigation circuitry 216 of FIG. 2, to reduce or eliminate non-linear characteristics of the system 600.

An impedance transformation may occur by producing different overdrive voltages of the first NMOS transistor 618 and the second NMOS transistor 632. In some implementations, an overdrive voltage of the first NMOS transistor 618 may be different from an overdrive voltage of the second NMOS transistor 632 due to differing gate-source voltages at the first NMOS transistor 618 and the second NMOS transistor 632, while the threshold voltages of the first NMOS transistor 618 and the second NMOS transistor 632 are approximately the same. In these implementations, the difference between the gate-source voltage of the first NMOS transistor 618 and the gate-source voltage of the second NMOS transistor 632 is due to the first impedance element 624 coupled between the gates of the first NMOS transistor 618 and the second NMOS transistor 632. In other implementations, the overdrive voltage of the first NMOS transistor 618 may be different from the overdrive voltage of the second NMOS transistor 632 due to differing threshold voltages of the first NMOS transistor 618 and the second NMOS transistor 632, while the gate-source voltages of the first NMOS transistor 618 and the second NMOS transistor 632 are approximately the same.

In a particular implementation, the overdrive voltage of the first NMOS transistor 618 is less than the overdrive voltage of the second NMOS transistor 632 because the gate-source voltage of the first NMOS transistor 618 is shifted down from the gate-source voltage of the second NMOS transistor 632 based on an impedance value of the first impedance device 624. Accordingly, when the overdrive voltage of the first NMOS transistor 618 is less than the overdrive voltage of the second NMOS transistor 632, the impedance value of the second NMOS transistor 632 is transformed to the impedance value of the first NMOS transistor 618 giving a very high impedance value at the input of the buffer circuitry 604. When the gate-source voltage of the first NMOS transistor 618 is in the sub-threshold region, the impedance of the first NMOS transistor 618 may increase exponentially as the overdrive voltage of the first NMOS transistor 618 decreases. The amount of increase in the impedance of the first NMOS transistor 618 may be based on the difference in the overdrive voltages of the first NMOS transistor 618 and the second NMOS transistor 632.

Further, when the W/L ratio of the first transistor circuit 616 is less than the W/L ratio of the second transistor circuit 630, the first transistor circuit 616 may serve as an impedance device and an impedance transformation may take place with respect to the first transistor circuit 616 that is proportional to the quotient of the W/L ratio of the second transistor circuit 630 and the W/L ratio of the first transistor circuit 616. Thus, by producing an impedance transformation due to differing overdrive voltages of the first NMOS transistor 618 and the second NMOS transistor 632 and by producing an impedance transformation due to differing W/L ratios of the first transistor circuit 616 and the second transistor circuit 630, a very high input impedance can be provided for the buffer circuitry 604.

Non-linearity mitigation circuitry and rectifying effects mitigation circuitry may operate to reduce or eliminate side effects that may be produced by the system 600. For example, the first NMOS transistor 618 may be non-linear, such that the first NMOS transistor 618 is high ohmic with high voltage signals from the source 602 and low ohmic with low voltage signals from the source 602. Non-linearity mitigation circuitry may reduce or eliminate non-linearities produced by the first NMOS transistor 618 by reducing the voltage drop over the first NMOS transistor 618. The non-linearity mitigation circuitry may be comprised of a voltage divider having a first element including the fourth impedance device 644 and a second element including a series connection of the second impedance device 640 with the third impedance device 642. The voltage divider comprising the second impedance device 640, the third impedance device 642, and the fourth impedance device 644 provides a voltage to the source of the first NMOS transistor 618 that has a value between the value of the bias voltage and the value of an input signal voltage. Thus, the voltage drop across the first NMOS transistor 618 is lowered, which has a linearizing effect on the output of the first NMOS transistor 618.

In addition, the first NMOS transistor 618 may produce rectifying effects, such that positive output signals are produced for negative voltage signals received from the source 602 for even-order functions. Rectifying effects mitigation circuitry comprised of a voltage divider including the second impedance device 640 and the third impedance device 642 may alleviate at least some of the rectifying effects of the first NMOS transistor 618. In an illustrative implementation, the second impedance device 640 and the third impedance device 642 may provide a mean voltage of the source and drain voltages of the first NMOS transistor 618, where the mean voltage is used to derive the gate-source voltage of the first NMOS transistor 618. In particular, the mean voltage of the drain and source voltages of the first NMOS transistor 618 is provided from a node between the second impedance device 640 and the third impedance device 642 to the voltage shifting circuitry 622 and the voltage shifting circuitry 622, in turn, provides a voltage signal to the gate of the first NMOS transistor 618. Thus, the gate voltage of the first NMOS transistor 618 is symmetrical or nearly symmetrical with respect to the source and the drain of the first NMOS transistor 618. Accordingly, rectifying effects of the first NMOS transistor 618 are reduced or eliminated because the positive half-wave of an input signal from the source 602 experiences similar conditions to the negative half-wave of an input signal.

Figure 7:
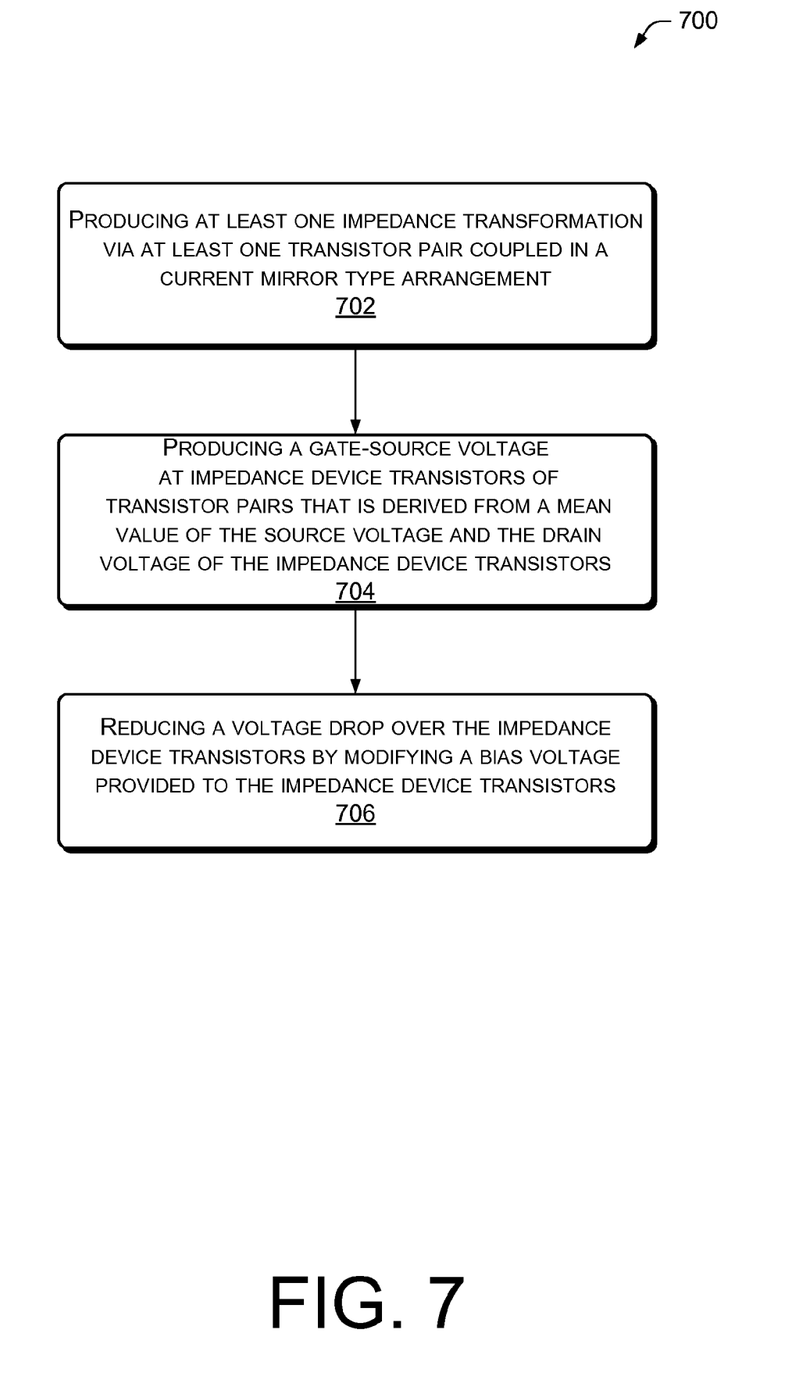
FIG. 7 is a flow diagram of a method of mitigating side effects of impedance transformation circuits.

FIG. 7 is a flow diagram of a method 700 of mitigating side effects produced by impedance transformations that utilize transistor circuits. Specifics of exemplary methods are described below. However, it should be understood that certain acts need not be performed in the order described, and may be modified, and/or may be omitted entirely, depending on the circumstances.

At 702, one or more impedance transformations are produced via impedance transformation circuitry of a high impedance circuit. The high impedance circuit may be connected to a line between a capacitive signal source and buffer circuitry. The impedance transformation circuitry may include one or more transistor pairs, with each transistor pair connected in a current mirror type arrangement. The transistor pairs may be comprised of NMOS transistors, PMOS transistors, or a combination thereof. An impedance transformation may take place due to differing W/L ratios between transistors of respective transistor pairs. Additionally, an impedance transformation may occur due to differing overdrive voltages between transistors of respective transistor pairs. A particular transistor of each transistor pair may operate as an impedance device transistor.

At 704, the method 700 includes producing a gate-source voltage at impedance device transistors of transistor pairs that is derived from a mean value of the drain voltage and the source voltage of the impedance device transistors. For example, a voltage divider may be coupled to a gate of an impedance device transistor and also coupled to receive the drain and source voltages of the impedance device transistor. For example, the voltage divider may receive a bias voltage provided to a source of the impedance device transistor. Additionally, a drain of the impedance device transistor may receive a voltage signal from a signal source, such as the source 102 of FIG. 1, and the voltage divider may receive a buffered version of the voltage signal received from the signal source. Thus, a positive half-wave of a signal received at the impedance device transistor from a signal source sees approximately the same conditions, as a negative half-wave of the signal from the signal source. In this way, any rectifying effects produced by the impedance device transistor may be minimized or eliminated.

At 706, the method 700 includes reducing a voltage drop over the impedance device transistor of each transistor pair of a high impedance circuit by modifying a bias voltage provided to the impedance device transistor. For example, a voltage divider may be coupled between the impedance device transistor and a bias point. Accordingly, the impedance device transistor receives some fraction of the bias voltage depending on the impedance values of the impedance devices comprising the voltage divider. In this way, the voltage drop across the impedance device transistor is comprised of the voltage of the signal received from the signal source and some portion of the bias voltage, rather than the full bias voltage signal, and the voltage drop across the impedance device transistor is reduced. By reducing the voltage drop over the impedance device transistor, non-linear effects produced by the impedance device transistor are mitigated.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. An apparatus comprising:
   impedance transformation circuitry to produce at least one impedance transformation, the impedance transformation circuitry coupled to buffer circuitry; and
   a voltage divider coupled to the impedance transformation circuitry, to the buffer circuitry, and to a bias point, the bias point to provide a bias voltage to the impedance transformation circuitry.

2. The apparatus of claim 1, further comprising a signal source coupled to the buffer circuitry.

3. The apparatus of claim 2, wherein the signal source is a capacitive signal source.

4. The apparatus of claim 2, wherein the buffer circuitry includes a first positive channel metal oxide semiconductor (PMOS) transistor and a second PMOS transistor, wherein a gate of the first PMOS transistor is coupled to the signal source and a source of the first PMOS transistor is coupled to a source of the second PMOS transistor.

5. The apparatus of claim 1, wherein the buffer circuitry is coupled to a load.

6. The apparatus of claim 1, wherein the voltage divider includes a first impedance device and a second impedance device, the first impedance device coupled to the buffer circuitry and to the impedance transformation circuitry and the second impedance device coupled to the bias point and to the impedance transformation circuitry.

7. The apparatus of claim 1, wherein the impedance transformation circuitry includes a first negative channel metal oxide semiconductor (NMOS) transistor, a gate of the first NMOS transistor coupled to a drain of a second NMOS transistor, and the gate of the first NMOS transistor coupled to an impedance device.

8. The apparatus of claim 1, wherein the voltage divider is coupled between the bias point and the bias circuitry.

9. The apparatus of claim 8, wherein the voltage divider is coupled to the bias circuitry.

10. An apparatus comprising:
    impedance transformation circuitry to produce at least one impedance transformation, the impedance transformation circuitry coupled to buffer circuitry and the impedance transformation circuitry further coupled to a bias point, the bias point to provide a bias voltage to the impedance transformation circuitry; and
    a voltage divider coupled to the impedance transformation circuitry, the voltage divider further coupled to the bias point and to the buffer circuitry.

11. The apparatus of claim 10, wherein the impedance transformation circuitry includes an impedance device.

12. The apparatus of claim 11, wherein the impedance transformation circuitry includes voltage shifting circuitry, the voltage shifting circuitry to modify a voltage of the impedance device.

13. The apparatus of claim 12, wherein the voltage shifting circuitry modifies a gate-source voltage of a transistor of the impedance device.

14. The apparatus of claim 11, wherein the impedance device includes a first NMOS transistor, a gate of the first NMOS transistor is coupled to an additional impedance device and the additional impedance device is coupled to a gate of a second NMOS transistor.

15. The apparatus of claim 14, wherein the additional impedance device is coupled to additional buffer circuitry.

16. The apparatus of claim 15, wherein the additional buffer circuitry includes an operational transconductance amplifier.

17. The apparatus of claim 15, wherein the additional buffer circuitry includes an operational amplifier.

18. The apparatus of claim 10, wherein the voltage divider is coupled between the bias point and the bias circuitry.

19. The apparatus of claim 18, wherein the voltage divider is coupled to the bias circuitry.

20. A method comprising:
    producing an impedance transformation by modifying an overdrive voltage of a first device of an impedance circuit with respect to an overdrive voltage of a second device of the impedance circuit; and
    reducing a voltage drop over the first device by modifying a bias voltage provided to the first device.

21. The method of claim 20, wherein an additional impedance transformation is produced based on a channel width to channel length ratio of the first device with respect to a channel width to channel length ratio of the second device.

22. The method of claim 20, wherein the bias voltage is modified by a voltage divider coupled to the first device.

23. The method of claim 20, further comprising producing a gate-source voltage at the first device that is derived from a mean value of a source voltage and a drain voltage of the first device.

24. An apparatus comprising:
    impedance transformation circuitry to produce at least one impedance transformation, the impedance transformation circuitry comprising:
    a transistor coupled to buffer circuitry and coupled to a bias point, the bias point to provide a bias voltage to the impedance transformation circuitry; and
    level-shifting circuitry coupled to the transistor, the level-shifting circuitry to provide a voltage to the transistor that is symmetrical or nearly symmetrical with respect to a drain of the transistor and a source of the transistor, and the voltage provided to the transistor produces an overdrive voltage that is less than another overdrive voltage.

25. The apparatus of claim 24, wherein a voltage of a bulk node of the transistor is symmetrical or nearly symmetrical with respect to the drain of the transistor and the source of the transistor.

* * * * *